United States Patent [19]

Cockrum et al.

[11] Patent Number: 4,524,378
[45] Date of Patent: Jun. 18, 1985

[54] ANODIZABLE METALLIC CONTACTS TO MERCURY CADMIUM TELLERIDE

[75] Inventors: Charles A. Cockrum, Goleta; Joan K. Chia; James F. Kreider, both of Santa Barbara, all of Calif.

[73] Assignee: Hughes Aircraft Company, El Segundo, Calif.

[21] Appl. No.: 516,416

[22] Filed: Jul. 21, 1983

Related U.S. Application Data

[63] Continuation of Ser. No. 174,963, Aug. 4, 1980, abandoned.

[51] Int. Cl.³ .................... H01L 23/48; H01L 21/306
[52] U.S. Cl. ........................................ 357/71; 357/61; 357/30; 357/65; 357/68; 357/23.2
[58] Field of Search ...................... 357/30, 61, 65, 68, 357/71, 23 NS

[56] References Cited

U.S. PATENT DOCUMENTS

| | | | |
|---|---|---|---|
| 3,386,011 | 5/1968 | Murray, Jr. et al. | 357/4 |
| 3,617,816 | 11/1971 | Riseman et al. | 357/68 |
| 3,634,203 | 1/1972 | McMahon et al. | 357/68 |
| 3,708,403 | 1/1973 | Koger et al. | 357/71 |
| 3,806,778 | 4/1974 | Shimakura et al. | 357/71 |
| 3,929,589 | 12/1975 | Ermanis et al. | 357/61 |
| 3,963,925 | 6/1976 | Breazeale | 357/61 |
| 3,977,018 | 8/1976 | Catagnus et al. | 357/61 |
| 3,987,480 | 10/1976 | Dignet et al. | 357/68 |
| 4,003,772 | 1/1977 | Hanazono et al. | 357/71 |
| 4,085,500 | 4/1978 | Hager et al. | 357/61 |
| 4,119,993 | 10/1978 | Hartnagel et al. | 357/23 NS |
| 4,133,724 | 1/1979 | Hartnagel et al. | 357/61 |
| 4,263,605 | 4/1981 | Christou et al. | 357/67 |
| 4,268,849 | 5/1981 | Gray et al. | 357/71 |
| 4,350,990 | 9/1982 | Lo | 357/61 |

Primary Examiner—William D. Larkins
Assistant Examiner—Charles S. Small, Jr.
Attorney, Agent, or Firm—Anthony W. Karambelas

[57] ABSTRACT

Metallic contacts to compound semiconductor devices which employ a native oxide for passivation are provided. The metallic contacts of the invention comprise at least two metal layers: a first layer making non-rectifying contact with the semiconductor surface and providing a diffusion barrier and a second layer thereon comprising an easily oxidizable metal. A low resistivity metal layer may optionally be interposed between the two metal layers for improved conductivity.

The metallic contact is formed prior to passivation. The diffusion barrier layer prevents diffusion of potentially deleterious materials into the semiconductor, while exposed portions of the oxidizable metal form an insulating oxide during anodic passivation in an electrolyte. The insulating oxide prevents disruption of the electric field distribution in the electrolyte, thereby eliminating passivating oxide and device non-uniformities commonly encountered in the formation of prior art metallic contacts and providing more uniform semiconductor oxide thickness.

14 Claims, 5 Drawing Figures

ANODIZABLE METALLIC CONTACTS TO MERCURY CADMIUM TELLERIDE

This is a continuation of application Ser. No. 174,963, filed Aug. 4, 1980 now abandoned.

BACKGROUND OF THE INVENTION

1. Field of the Invention

This invention relates to metallic contacts to compound semiconductor devices, and, more particularly, to metallic contacts that are compatible with anodic formation of a native oxide used to passivate the semiconductor surface.

2. Description of the Prior Art

Compound semiconductor devices include devices which are fabricated employing mixed valence semiconductor materials; examples include II-VI compounds such as (Hg,Cd)Te, IV-VI compounds such as (Pb,Sn)Te, and III-V compounds such as GaAs, InAs, InSb, (In,Ga)Sb and In(As,Sb). Typical devices include photoconductors and photodiodes.

Such devices made in the past utilized either a non-oxidizing top contact metal such as gold or a rapidly diffusing metal such as indium. Following such metallization, a native oxide would be anodically grown to passivate exposed portions of the semiconductor surface. Use of the foregoing metallic contacts present many problems. For example, gold distorts or shorts out the electric field in the anodizing electrolyte, thereby causing non-uniform oxide thickness. Such non-uniform oxide thickness causes variation in the degree of accumulation or depletion of charge at the interface between the semiconductor and oxide, thus causing non-uniformity in the electrical characteristics of the device. The gold is also electrochemically attacked and often etched away during the anodization process, thereby yielding oversized devices and/or a rectifying junction at the interface between the active area of the device and the contact metal. On the other hand, it is known that indium will diffuse into and eventually destroy certain devices, such as those employing (Hg,Cd)Te.

SUMMARY OF THE INVENTION

In accordance with the invention, a semiconductor device comprising a compound semiconductor material, which is anodically oxidizable to form a passivating native oxide on exposed surfaces, includes a metallic contact comprising:

(a) a contact metal layer formed on a portion of the semiconductor surface, the contact metal layer forming a substantially non-rectifying contact with the semiconductor surface and providing a diffusion barrier; and (b) an oxidizable metal layer formed on top of the contact metal layer, the oxidizable metal selected from the group consisting of metals occupying a position between hydrogen and magnesium in the Electromotive Series. Following formation of the metal contact, exposed surfaces of the semiconductor material are then passivated by anodically forming a native oxide thereon.

As a consequence of the metallic contact configuration of the invention, the top metal layer forms an insulating oxide when the semiconductor device is placed in an electrolytic anodizing solution to passivate exposed semiconductor surfaces. Oxide and device non-uniformities inherent with previously used metallic contact systems are eliminated, since the oxidized metal will not continue to conduct current. Thus, the electric field distribution in the electrolyte will not be disrupted by the presence of the metal.

DETAILED DESCRIPTION OF THE INVENTION

Figure 1:
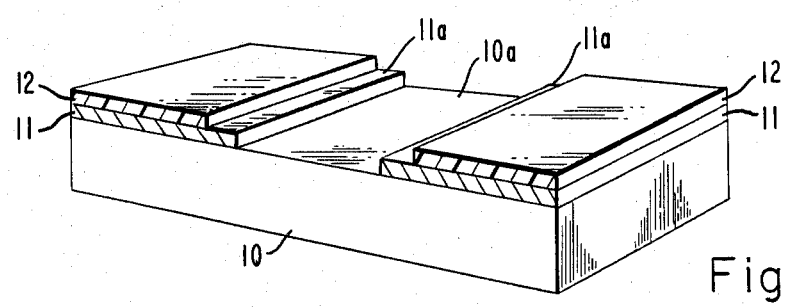
FIG. 1 is a perspective view, partly in section, of a metallic contact partially exposed by a photoresist mask to a passivating electrolyte in accordance with the prior art.
Figure 2:
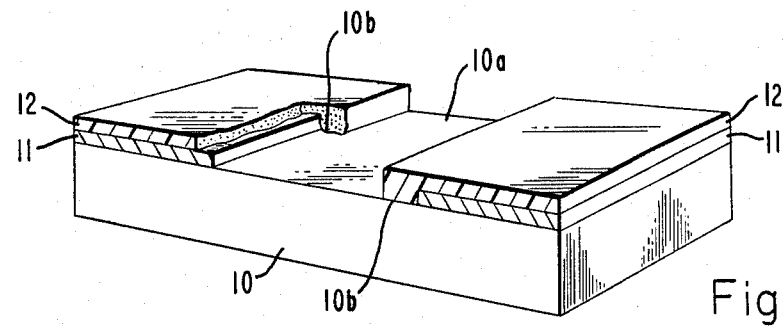
FIG. 2 is a perspective view, partly in section, of a photoresist mask extending over the metallic contact/semiconductor interface in accordance with the prior art.
Figure 3:
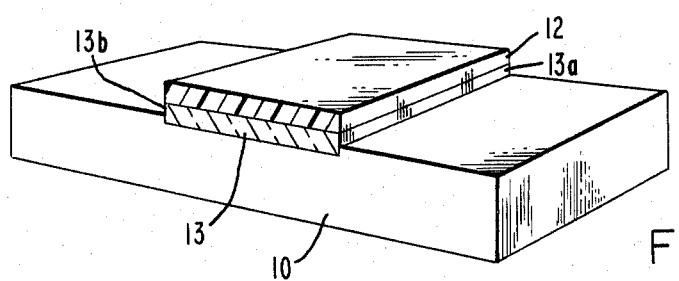
FIG. 3 is a perspective view, partly in section, depicting anodization prior to metallization in accordance with the prior art.

FIGS. 1-3 depict problems associated with various attempts in the prior art to form metallic contacts 11 on the surface of a semiconductor 10 and to passivate exposed semiconductor surfaces, e.g., 10a. Here, a simple photodetector is depicted, the active device lying in the area between the two contacts. Historically, forming a native oxide on a compound semiconductor surface after metallic contacts have been applied has presented two problems. As shown in FIG. 1, a photoresist film 12 is processed to expose some of the contact metal 11 to ensure that the total device surface 10a is passivated. During anodic passivation, exposed metal portions 11a will distort or short out the electric field in the electrolyte (not shown) near the metal interface, causing non-uniform oxide growth and electrochemical attack of the metal. In some cases, the exposed metal portions are completely etched away, yielding an oversized device-sensitive area and a rectifying junction between the device and its electrode.

Alternately, as shown in FIG. 2, if the photoresist film 12 completely covers the metal 11, it must also cover a small part 10b of the semiconductor surface, thereby leaving part of the device unpassivated. This condition is also unacceptable, as it often yields a noisy, rectifying junction in series with the contact.

Since the anodically grown oxide is highly soluble in most basic or acidic solutions, it is not possible to anodize the device before metallization, because the semiconductor oxide would be undercut by many photoresist developers and metal etchants subsequently used to define the location of the contact metal. This condition is shown in FIG. 3, in which the exposed edges 13a, 13b of passivating oxide 13 are susceptible to chemical attack by caustic photoresist developers employed in defining photoresist film 12 and acidic etchants employed in defining subsequently deposited metal contacts (not shown).

In accordance with the invention, a metallic contact for use on compound semiconductor devices such as (HgCd)Te and InSb that is compatible with a grown native oxide used to passivate semiconductor surfaces is provided. The metallic contact comprises (a) a contact metal layer formed on a portion of a semiconductor surface, the contact metal layer forming a substantially non-rectifying contact with the semiconductor surface and providing a diffusion barrier and (b) an oxidizable metal layer on the contact metal layer which is selected from the group consisting of metals occupying a position between hydrogen and magnesium in the Electromotive Series. Examples of a suitable diffusion barrier metal include titanium, chromium and palladium, while examples of a suitable oxidizable metal include titanium, chromium, aluminum and indium. When placed in an electrolytic anodizing solution, the top layer forms an insulating oxide so that it will not continue to conduct current and disrupt the electric field distribution in the electrolyte. Consequently, oxide non-uniformities inherent with prior art contact systems are eliminated.

Figure 5:
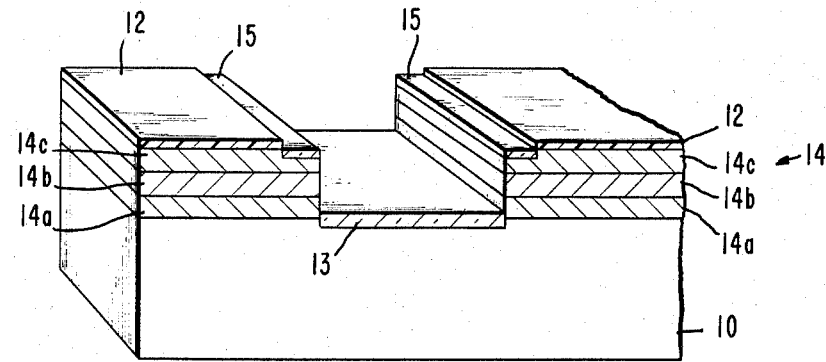
FIG. 5 is a perspective view, partly in section, depicting an alternate embodiment of the invention.
Figure 4:
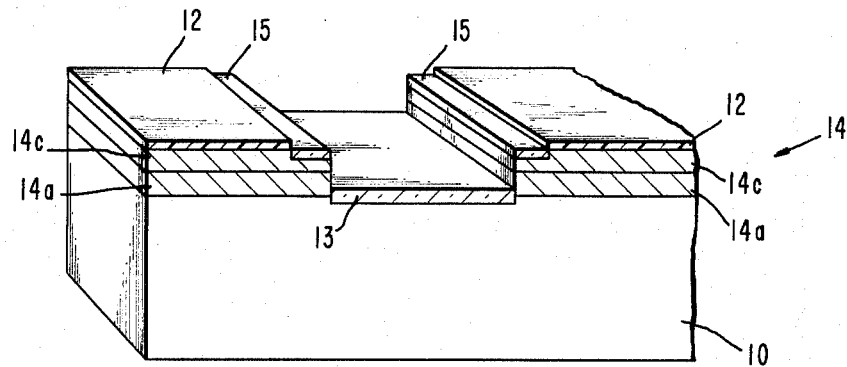
FIG. 4 is a perspective view, partly in section, depicting the multilayer metallic contact of the invention, which allows uniform passivation of semiconductor surfaces.

As shown in FIGS. 4 and 5, contact to semiconductor 10 is made through metal contact 14 comprising at least two layers 14a and 14c. Layer 14a is a metal such as titanium, chromium or palladium and acts as a diffusion barrier to metals such as gold or indium which would otherwise adversely dope the semiconductor. Layer 14c is a metal such as aluminum, indium, titanium or chromium which oxidizes rapdily to form oxide layer 15 when exposed to an electrolytic anodizing solution (not shown). Therefore, the portion of the metal not covered with photoresist film 12 ceases to disrupt the electric field distribution in the electrolyte, and oxide 13 of substantially uniform thickness is formed. Also, the contact metal is not etched by the electrolyte, so device geometry and contact integrity are maintained. If desired, an intermediate metal layer 14b (shown in FIG. 5) such as gold may be used to provide a low resistance current path. The purity of all metal layers is that employed in normal commercial practice.

The metallic contact of the invention is useful in a variety of semiconductor devices, including the fabrication of photoconductive (Hg,Cd)Te infrared detectors. The metallic contact of the invention provides improved yield and performance and reduced low-frequency noise by eliminating electrochemical attack of the metallic contact at the interface with the detector element. It also improves element-to-element uniformity because of the more uniform passivating oxide thickness obtained.

The semiconductor materials to which the invention applies are compound semiconductors, especially those of classes II–VI, IV–VI and III–V; examples of such compound semiconductors include (Hg,Cd)Te, (Pb,Sn)Te, GaAs, InAs, InSb, (In,Ga)Sb and In(As,Sb). The compound semiconductors which are advantageously employed in the practice of the invention are those which are anodically oxidizable to form a passivating native oxide layer on exposed surfaces. Such anodic oxidation employs procedures well-known in the art.

The first metal layer, contact metal layer 14a, is directly in contact with the semiconductor surface; this layer provides a diffusion barrier to subsequently deposited metals and forms a substantially non-rectifying junction with the semiconductor surface. The non-rectifying junction ensures low noise and may be either truly ohmic or non-rectifying in the sense that conduction bands due to differences in work functions of the respective materials (metal and semiconductor) are bent upon contacting the semiconductor with metal such that tunneling of charge carriers can readily occur. The specific contact metal employed may differ from one compound semiconductor to another, so long as the metal possesses the foregoing properties. In the case of (Hg,Cd)Te, a suitable contact metal comprises a metal selected from the group consisting of titanium, chromium, nickel and palladium, while in the case of InSb, a suitable contact metal comprises a metal selected from the group consisting of titanium and palladium. For (Hg,Cd)Te, titanium and palladium are preferred, since they provide the lowest contact noise and good adhesion to the semiconductor surface.

The thickness of contact metal layer 14a ranges from about 300 to 1,000 Å. If the metal layer is substantially less than about 300 Å, then it will not form an adequate diffusion barrier, while if it is considerably thicker than about 1,000 Å, then internal stresses are generated during deposition which cause subsequent peeling of the metal layer. Preferably, the thickness of contact metal layer 14a ranges from about 600 to 800 Å.

Contact metal layer 14a may be deposited by any number of procedures employing process parameters well-known in the prior art, and the method of the deposition of this layer does not form a part of this invention. For example, it may be deposited by vacuum evaporation such as electron beam evaporation or RF or DC sputtering or thermal evaporation. Alternatively, it may be electroplated; for example, palladium may be electroplated on (Hg,Cd)Te and InSb. Yet another procedure includes ion beam deposition.

Metal layer 14b is optional and may be employed to form a low resistance contact, such as required for 50 $\Omega/\square$ $Hg_{80}Cd_{20}Te$ photoconductors. In such a case, since the first layer 14a is thin and typically has a high resistivity (e.g., in the case of titanium), then a lower resistivity would be required, which is provided by layer 14b of low resistivity metal. Alternatively, layer 14b may be used in those situations when the topography of the device is other than planar (e.g., mesa). For example, bonding contact wires directly to (Hg,Cd)Te devices formed on sapphire substrates is difficult, since the (Hg,Cd)Te is soft. In such cases, a contact path extends across the surface of the semiconductor island, down one side and to an exposed surface of the sapphire substrate. Contact is accordingly made by wire bonding to metal supported on the harder substrate. A thin layer 14a could not maintain integrity under such topological contouring, and, accordingly, a thicker, low resistivity layer 14b would be suitably employed.

The characteristics of a metal used for layer 14b is that it have low resistance, physical stability (i.e., no whisker growth and no phase changes during processing) and no intermetallic alloy formation to other metals (layers 14a and 14c) which could form brittle products. That is, the low resistivity layer must be substantially metallurgically compatible with the contact metal and the oxidizable metal. Further, metal 14b should evidence good adhesion to the underlying metal 14a, be ductile and facilitate lead attachment. Gold and lead are metals that are advantageously employed as optional intermediate layer 14b; gold is preferred because of its compatability with contacting to external circuitry.

The thickness of layer 14b ranges from about 1,000 to 20,000 Å; the particular thickness depends on specific device design. Factors influencing thickness include the final required resistance (the lower the required resistance, the thicker the metal layer), topology (the higher the contour, the thicker the layer), and device geometry (the closer the spacing, the thinner the layer). For example, for typical (Hg,Cd)Te photoconductors, gold ranging in thickness from about 15,000 to 20,000 Å is preferably employed, while for typical InSb diodes, gold having a thickness of about 5,000 Å is preferably employed.

Layer 14b may be formed employing the same processes as layer 14a. However, in situations where comparatively thick films are desired, a thin film may first be evaporated, followed by electroplating to form thicker films for cost effectiveness.

Metal layer 14c is one that is easily oxidizable, and lies above hydrogen (E>0.00 V) and below magnesium (E<2.37 V) on the Electromotive Series. Since exposed portions of this metal layer are oxidized during passivation by electrolysis, then it must lie above hydrogen; otherwise, it will not oxidize. On the other hand, if the metal lies above magnesium, it will either oxidize too rapidly and be consumed during electrolysis or oxidize in air, forming a powdery compound. Examples of suitable metals include aluminum, titanium, nickel, chromium, indium, niobium, tantalum, tungsten and vanadium. Because of intermetallic formation with gold, indium and aluminum may not be desirable in certain applications. Titanium is especially preferred, since it is convenient in a metallic contact comprising Ti-Au-Ti wherein only two sources (Ti and Au) are required for vacuum deposition and etchants are readily available to selectively etch titanium but not gold for contact definition.

The thickness of layer 14c ranges from about 500 to 1,000 Å. If the layer is too thin the electrolytic process etches through before the metal is adequately oxidized, while if the layer is too thick, internal stresses form during deposition which cause subsequent peeling of the layer. Preferably, the thickness of layer 14c ranges from about 600 to 800 Å.

Layer 14c may be deposited by any of the processes mentioned above in connection with layer 14a.

Following deposition of metallic contact 14, exposed surfaces of the semiconductor are then passivated by forming a native oxide 13 thereon. This passivation is performed anodically in an aqueous solution. There are many variations of the specific process parameters employed during anodization, and these are well-known in the prior art.

A platinum cathode is usually employed in anodic oxidation, with anodic contact being made through the metallic contact 14 to the semiconductor; typically, aluminum wire is connected to the metallic contact. During the course of passivation, a metal oxide 15 is formed on portions of the surface of metal layer 14c exposed by a photoresist film 12. Once the metal oxide is formed, then the semiconductor oxide 13 is formed over the exposed surfaces of the semiconductor 10 to passivate them.

Following passivation, portions of layer 14c are removed (not shown); usually these are removed in the contact bonding area only. Removal is conveniently done by chemical etching.

In the fabrication of a typical semiconductor detector having already formed thereon detector sensitive areas, a photoresist film is deposited over the semiconductor surface, including the detector sensitive areas. The photoresist film is processed to expose that portion of the semiconductor surface onto which metallic contacts of the invention are to be deposited. In the preferred embodiment employing (Hg,Cd)Te devices, titanium, gold and titanium within the described thickness ranges are evaporated over the entire photoresist-covered semiconductor surface. The photoresist is then lifted off, removing metal everywhere except in the contact areas. A second photoresist is then applied over the semiconductor surface, including metal contact areas, which is then processed to expose only the detector elements plus a small portion on each side. This "picture frame" around each element is typically about 0.2 to 0.3 mils extra and ensures that the detector elements will be completely passivated. The detector sensitive areas are then anodically passivated. The photoresist mask is removed. A third photoresist mask is applied and processed which exposes the bonding areas, formed on a portion of the contacts. Portions of the top layer (e.g., titanium) are etched away, leaving exposed portions of the underlying low resistive contact (e.g., gold), ready for subsequent wire bonding thereto or electroplating thereof.

EXAMPLES

From the same boule of 0.1 eV $Hg_{80}Cd_{20}Te$, adjacent wafers were processed to form photoconductors comprising linear arrays of 2×2 mil elements, with 200 elements per array and six arrays per wafer. On one wafer, a three layer metallic contact comprising 700 Å titanium, 15,000 Å gold and 500 Å titanium, all deposited by electron beam evaporation, was formed. On the other wafer, a two layer metallic contact comprising 700 Å titanium and 15,000 Å gold, also deposited by electron beam evaporation, was formed. The only difference was the formation of an easily oxidizable metal layer on the first wafer. The following properties were measured at 77° K.: resistance R in ohms, noise N in $nV/Hz^{\frac{1}{2}}$, responsivity $R_\nu$ in $10^3$ V/Watt and signal-to-noise ratio D* in $cm\text{-}Hz^{\frac{1}{2}}/Watt$. These measurements are listed in the Table below; the data associated with each sample listed represent average results of a 200 element array.

| EFFECTS OF DIFFERENT METALLIC CONTACTS ON PROPERTIES OF (Hg, Cd)Te PHOTOCONDUCTORS | | | | |
| --- | --- | --- | --- | --- |
| Sample | R | N | $R_\nu$ | D* |
| Ti—Au—Ti—1 | 76 | 4.46 | 38.4 | 3.92 |
| 2 | 72 | 4.01 | 37.3 | 3.83 |
| 3 | 69 | 3.79 | 36.0 | 3.86 |
| 4 | 64 | 3.23 | 33.0 | 4.11 |
| 5 | 64 | 3.20 | 33.0 | 4.16 |
| 6 | 65 | 3.59 | 35.7 | 4.15 |
| Ti—Au—1 | 82 | 6.43 | 57.3 | 3.63 |
| 2 | 76 | 6.57 | 57.3 | 3.53 |
| 3 | 75 | 6.72 | 56.2 | 3.40 |
| 4 | 74 | 6.66 | 55.2 | 3.36 |
| 5 | 76 | 6.73 | 55.6 | 3.35 |
| 6 | 81 | 6.93 | 56.4 | 3.31 |

As seen from an examination of the Table, devices having a metallic contact in accordance with the invention evidenced lower noise and an improved signal-to-noise ratio over those devices having a metallic contact outside the scope of the invention.

What is claimed is:

1. A semiconductor device comprising a compound semiconductor material consisting essentially of (Hg,Cd)Te, a metallic contact attached thereto, a uniform passivating native semiconductor oxide layer adjacent said metallic contact and a surface of said compound semiconductor material, the otherwise exposed surface of said semiconductor material being anodically oxidizable to form said passivating native semiconductor oxide layer thereon, said metallic contact comprising a plurality of metal layers including:
  (a) a contact metal layer formed on a surface portion of said semiconductor material, said contact metal layer forming a substantially non-rectifying contact with said semiconductor material and providing a diffusion barrier and comprising a metal selected from the group consisting of titanium, chromium, nickel and palladium;
  (b) a top metal layer formed so as to overlie said metal layers, the exposed surface portion of said top metal layer being anodically oxidizable to form a metal oxide thereon and thereby prevent any significant interference by said metal layers with the substantially uniform formation of said passivating native semiconductor oxide, said top metal layer being selected from the group consisting of metals occupying a position between hydrogen and magnesium in the Electromotive Series; and
  (c) an oxide layer formed on said top metal layer, the thickness of said oxide layer being sufficient to substantially prevent any interference by said metallic contact with the anodic oxidation of said compound semiconductor material at any time subsequent to the formation of said oxide layer.

2. The device of claim 1 further comprising a low resistance metal layer between said contact metal layer and said top metal layer, said low resistance metal layer being physically stable and metallurgically compatible with said contact metal and said top metal.

3. The device of claim 2 in which said low resistance metal layer comprises a metal selected from the group consisting of gold and lead.

4. The device of claim 2 in which the thickness of said low resistance metal layer ranges from about 1,000 to 20,000 Å.

5. The device of claim 3 in which said low resistance metal layer consists essentially of gold.

6. The device of claim 1 in which said contact metal layer consists essentially of a metal selected from the group consisting of titanium and palladium.

7. The device of claim 1 in which the thickness of said contact metal layer ranges from about 300 to 1,000 Å.

8. The device of claim 7 in which the thickness of said contact metal layer ranges from about 600 to 800 Å.

9. The device of claim 1 which said top metal layer comprises a metal selected from the group consisting of aluminum, titanium, nickel, chromium, indium, niobium, tantalum, tungsten and vanadium.

10. The device of claim 9 in which said top metal layer consists essentially of titanium.

11. The device of claim 1 in which the thickness of said top metal layer ranges from about 500 to 1,000 Å.

12. The device of claim 11 in which the thickness of said top metal layer ranges from about 600 to 800 Å.

13. A semiconductor device comprising (Hg,Cd)Te which includes a metallic contact comprising:
  (a) a contact metal layer formed on a portion of a surface of said (Hg,Cd)Te comprising a metal selected from the group consisting of titanium, chromium, nickel and palladium, and ranging in thickness from about 300 to 1,000 Å;
  (b) a low resistance metal layer formed on said contact layer comprising a metal selected from the group consisting of gold and lead and ranging in thickness from about 1,000 to 20,000 Å; and
  (c) an oxidizable metal layer formed on said low resistance metal layer comprising a metal selected from the group consisting of titanium, nickel, chromium, niobium, tantalum, tungsten and vanadium and ranging in thickness from about 500 to 1,000 Å.

14. The device of claim 13 in which said contact metal layer and said oxidizable metal layer consist essentially of titanium and said low resistance metal layer consists essentially of gold.

* * * * *